(12) United States Patent
Chang et al.

(10) Patent No.: US 8,281,280 B2
(45) Date of Patent: Oct. 2, 2012

(54) METHOD AND APPARATUS FOR VERSATILE CONTROLLABILITY AND OBSERVABILITY IN PROTOTYPE SYSTEM

(75) Inventors: Ying-Tsai Chang, Fremont, CA (US); Hwa Mao, Taipei (TW); Swey-Yan Shei, Cupertino, CA (US); Ming-Yang Wang, Lafayette, CA (US); Yu-Chin Hsu, Cupertino, CA (US)

(73) Assignees: SpringSoft, Inc., Hsinchu (TW); SpringSoft USA, Inc., San Jose, CA (US)

( * ) Notice: Subject to any disclaimer, the term of this patent is extended or adjusted under 35 U.S.C. 154(b) by 2 days.

(21) Appl. No.: 13/025,809

(22) Filed: Feb. 11, 2011

(65) Prior Publication Data

US 2011/0202894 A1 Aug. 18, 2011

Related U.S. Application Data

(60) Provisional application No. 61/304,328, filed on Feb. 12, 2010.

(51) Int. Cl.
*G06F 17/50* (2006.01)
(52) U.S. Cl. ......... 716/136; 716/106; 716/108; 716/111
(58) Field of Classification Search .................. 716/100, 716/106, 108, 111, 116, 117, 136
See application file for complete search history.

(56) References Cited

U.S. PATENT DOCUMENTS

| | | | | |
|---|---|---|---|---|
| 5,457,408 A | * | 10/1995 | Leung | 326/38 |
| 5,896,494 A | * | 4/1999 | Perugini et al. | 714/27 |
| 5,991,897 A | * | 11/1999 | Perugini et al. | 714/27 |
| 6,002,868 A | * | 12/1999 | Jenkins et al. | 717/105 |
| 6,754,881 B2 | * | 6/2004 | Kuhlmann et al. | 716/117 |
| 7,353,162 B2 | | 4/2008 | Huang et al. | |
| 7,673,265 B2 | * | 3/2010 | Akiba et al. | 716/106 |

* cited by examiner

*Primary Examiner* — Sun Lin
(74) *Attorney, Agent, or Firm* — Finnegan, Henderson, Farabow, Garrett & Dunner, LLP (57) ABSTRACT

Methods and systems for testing a design under verification (DUV), the method including receiving, at an interface, configured Field Programmable Gate Array (FPGA) images and runtime control information, wherein each of the FPGA images contains a respective portion of the DUV, and a respective verification module associated with a respective FPGA device. The method further includes, sending, by the interface, each of the FPGA images to each of the respective FPGA devices associated with each of the respective FPGA images. The method also includes, sending, by the interface, timing and control information to each of the respective verification modules based on runtime control information received from the host workstation. In response to receiving timing and control information, each of the respective verification modules, controls each of the respective portions of the DUV in each of the respective FPGA devices.

17 Claims, 5 Drawing Sheets

Figure 5

METHOD AND APPARATUS FOR VERSATILE CONTROLLABILITY AND OBSERVABILITY IN PROTOTYPE SYSTEM

RELATED APPLICATIONS

This application claims the benefit of priority of U.S. Provisional Application No. 61/304,328, filed Feb. 12, 2010, and titled "Method and Apparatus for Versatile Controllability and Observability in Prototype System," the contents of which are herein incorporated by reference in its entirety.

TECHNICAL FIELD

The present disclosure generally relates to semiconductors and integrated circuit systems and, more specifically, to design verification systems and methods utilizing a prototype system.

BACKGROUND

Highly-integrated system-on-chip (SoC) devices power a wide a variety of products to serve the demands of even wider variety of software applications. To meet these demands, SoC devices continue to increase in size and complexity. Though aided by advance semiconductor processing technologies and silicon-proven third-party intellectual property, the development of highly-integrated SoCs increases the burdens on design verification teams. In some cases, verification consumes the majority of an SoC development cycle.

SoC design verification approaches may vary. Optimized for speed, software development, hardware development, or system validation, each approach provides varying levels of observability and control. Field programmable gate array (FPGA) prototype systems, for example, may provide improved system execution time. Some FPGA SoC verification systems, nevertheless, lack the ability to isolate the root cause of discovered errors due to the lack of visibility into the signal values within the design. Common deficiencies on FPGA vendor-specific verification tools include access to a limited number of signals, and limited sample capture depth. Even combined with an external logic analyzer, FPGA vendor-specific verification tools lack sufficient capabilities to isolate root cause errors during SoC verification.

It is therefore desirable to have methods or apparatus that may meet the design verification demands of highly-integrated SoC devices in certain application or may provide SoC design verification systems having improved control and observability of signals on FPGA-based electronic prototype systems.

SUMMARY

Consistent with some embodiments of the present disclosure, a test system may include a first interface component configured to provide a configured image representative of at least a portion of a user design and an associated verification module, and a second interface component configured to provide timing and control information to the associated verification module based on at least one of the configured image and runtime control information received from the first interface component. The associated verification module may be coupled with the second interface component. The verification module may also be configured to control the device and monitor the device state of the at least a portion of the user design in response to the timing and control information received from the second interface component.

Consistent with some embodiments of the present disclosure, a method of testing may include receiving, at a first interface component, a configuration parameter associated with a configured image representative of at least a portion of a user design and an associated verification module. The method may further include, sending, using the first interface component, the configured image to a device, and sending, using a second interface component, timing and control information to the verification module based on at least one of the configuration image and runtime control information received from the first interface component. In some embodiments, in response to receiving the timing and control information from the second interface component, the verification module may control the device and/or monitor the device state of at least a portion of the user design.

Consistent with some embodiments of the present disclosure, a computer readable medium comprising instructions that when executed by a processor, cause the processor to perform the method of testing. The method of testing may include receiving, at a first interface component, a configuration parameter associated with a configured image representative of at least a portion of a user design and an associated verification module. The method may further include, sending, using the first interface component, the configured image to a device, and sending, using a second interface component, timing and control information to the verification module based on at least one of the configuration image and runtime control information received from the first interface component. In some embodiments, in response to receiving the timing and control information from the second interface component, the verification module may control the device and/or monitor the device state of at least a portion of the user design.

Additional features and advantages of the disclosure will be set forth in part in the description which follows. The features and advantages of the disclosed embodiments will be realized and attained by the elements and combinations particularly pointed out in the appended claims.

BRIEF DESCRIPTION OF THE DRAWINGS

The accompanying drawings, which are incorporated in and constitute a part of this specification, illustrate embodiments disclosed herein, together with the description, serve to explain the principles of the disclosed embodiments.

DETAILED DESCRIPTION

Reference will now be made in detail to disclosed embodiments illustrated in the accompanying drawings. Wherever possible, the same reference numbers will be used throughout the drawings to refer to the same or like portions. It should be noted that the drawings are in greatly simplified form and are not to precise scale.

In the following description, the terms "coupled" and "connected," along with their derivatives, may be used. It should be understood that these terms are not intended as synonyms for each other. Rather, in particular embodiments, "connected" and/or "coupled" may be used to indicate that two or more elements are in direct physical or electronic contact with each other. However, "coupled" may also mean that two or more elements are not in direct contact with each other, hut yet still cooperate, communicate, and/or interact with each other.

Figure 1:
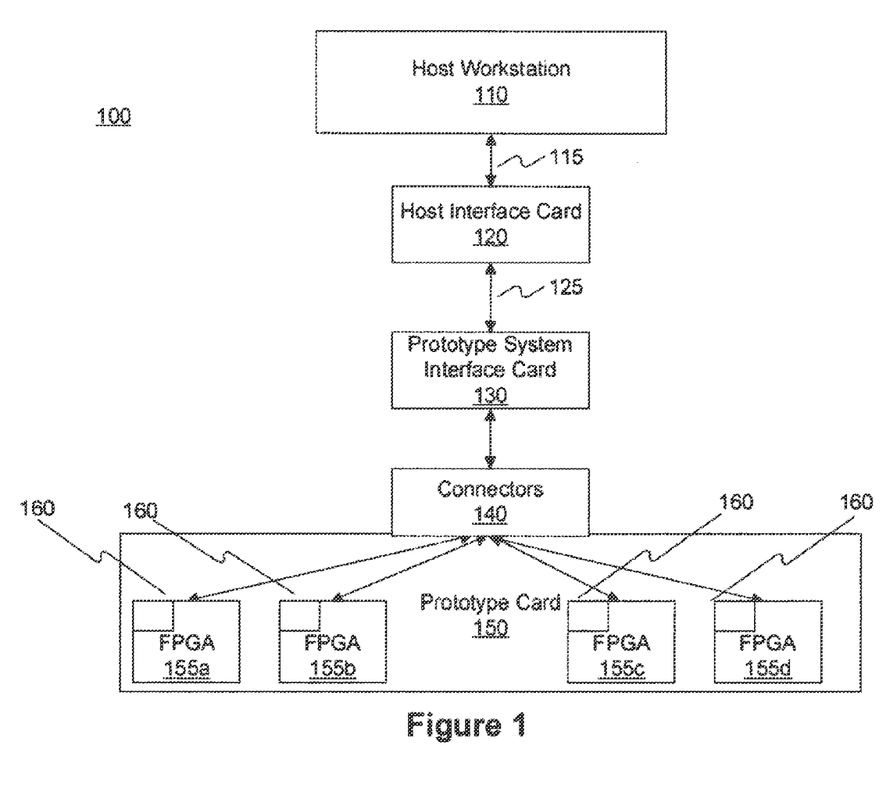
FIG. 1 illustrates an exemplary prototype system diagram consistent with disclosed embodiments.

FIG. 1 illustrates an exemplary prototype system diagram 100 consistent with disclosed embodiments. By way of example, and as illustrated in FIG. 1, prototype system 100 may include a combination of hardware components, interface cards, and a reconfigurable verification module adapted to improve visibility and control of a device under test during the design verification process. For example, in some embodiments, prototype system 100 may include workstation 110, host interface card 120, prototype system interface card 130, and prototype board 150 comprised of one or more devices under test (DUT). Additionally, a verification module 160 may be configured and combined with the portion of DUT for each FPGA chip.

Workstation 110 may be coupled to host interface card 120 over host communication channel 115 using an interface communication protocol, such as one of the computer interface standards. For example, in some embodiments, host communication channel 115 may be a wired communication method, such as Peripheral Component Interconnect (PCI) Express, Ethernet, or other interface methods allowing exchange of commands and information between host workstation 110 and host interface card 120.

Figure 2:
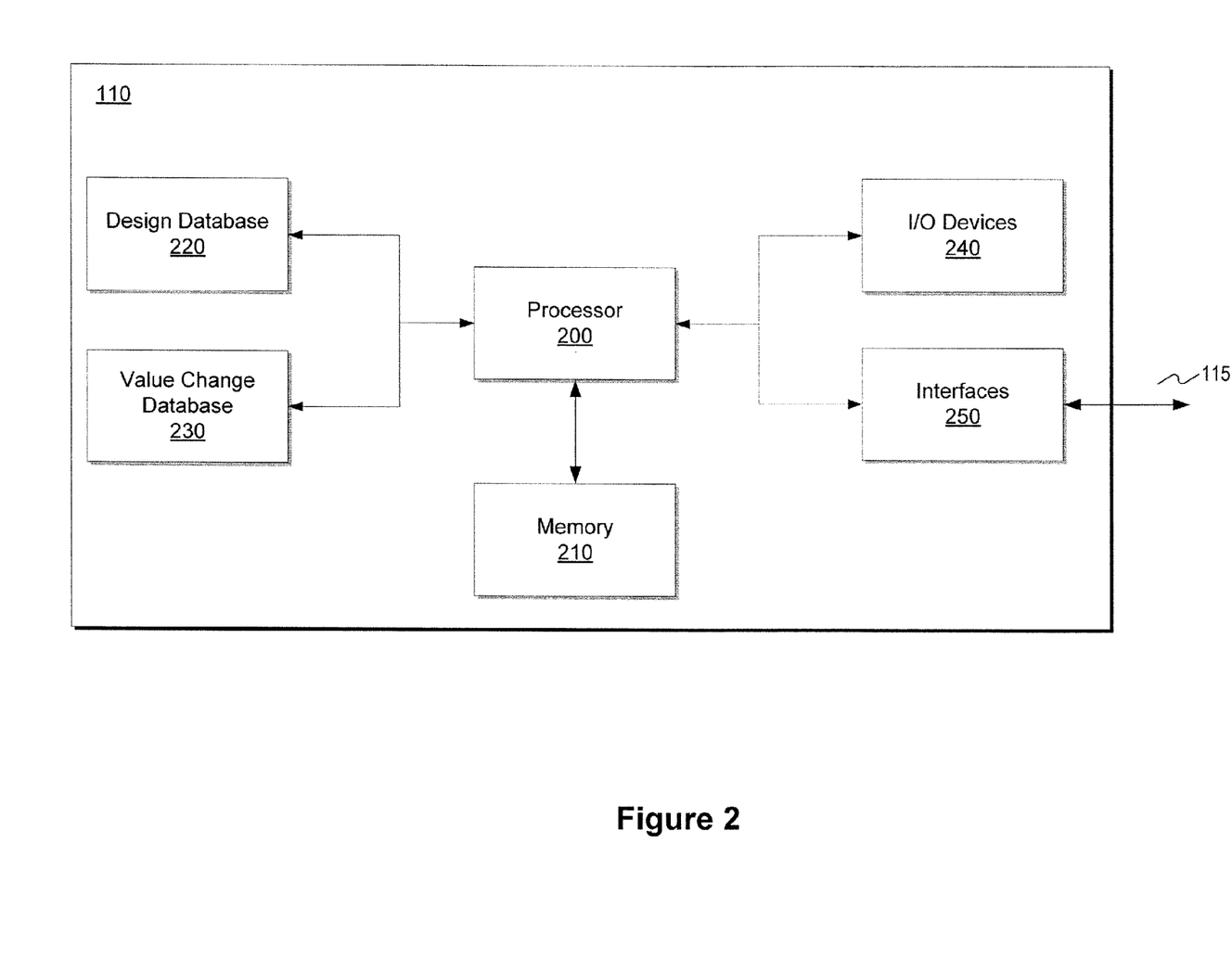
FIG. 2 illustrates a block diagram of an exemplary workstation consistent with disclosed embodiments.

FIG. 2 illustrates a block diagram of an exemplary workstation 110 consistent with disclosed embodiments. By way of example, and as illustrated in FIG. 2, host workstation 110 may include one or more of the following components: at least one processor 200 configured to execute computer programs instructions to perform various prototype system instructions and methods, memory 210 configured to store and provide information and computer program instructions, design database 220 configured to maintain runtime software and design information, value-change database 230 to store information received from prototype card 150, I/O devices 240, and interfaces 250.

As used herein, the term "processor" may include an electric circuit that executes one or more instructions. For example, such a processor may include one or more integrated circuits, microchips, microcontrollers, microprocessors, embedded processor, all or part of a central processing unit (CPU), digital signal processors (DSP), FPGA or other circuit suitable for executing instructions or performing logic operations. Processor 200 may be a special purpose process in that it may be configured and programmed to operate as a verification processor programmed to exchange commands and data with prototype card 150. For example, processor 200 may act upon instructions and data output from memory 210, design database 220, value change database 230, I/O devices 240, interfaces 250, or components (not shown). In some embodiments, processor 200 may be coupled to exchange data or commands with memory 210, design database 220, and value change database 230. For example, processor 200 may execute instructions that send FPGA image data containing verification module 160 and a portion of DUT to one or more of FPGA chips 155a-155d during prototype system downloads.

In accordance with some embodiments, verification module 160 may be at least one of instrumentation circuitry and logic modules configured to perform traditional logic analysis instrumentation functions. Logic analysis functions performed by verification module 160, may include, for example, sampling of signal values, state analysis, protocol analysis, and triggering. In some embodiments, verification module 160 may be synthesizable or soft intellectual property (IP). Configuration parameters defining verification module 160 may be set during the design verification setup process, such as in a manner similar to flows for programming FGPA chips. For example, during setup in some embodiments, the setup flow may automatically integrate third party synthesis and place and route tools, automatically or manually partition a design, and construct a design database for runtime software usage. A setup flow may include, for example, an automatic process for a pre-partitioned design, where the register transfer language (RTL) partitioning tool includes either a third party tool or a user's own manual partitioning. Alternatively or additionally, a setup flow may also include a flow where the user's design was not manually partitioned at the RTL level.

To optimize the physical pin resources available in a particular prototype card 150, verification module 160 comprises both design-dependent and design-independent circuitry. For example, verification module 160 may include a design-dependent circuit, configured to connect to and probe specific signals. A probe or signal probe may include circuitry configured to analyze and troubleshoot a particular signal. Utilizing access to the design database 220 associated with the device under test, data dependent circuitry may be reconfigured during a test process to modify, remove, or add probes. Verification module 160 may also include design-independent circuits configured to encode and decode data. For example, data-independent circuits may include, among other circuit types, first input first output (FIFO) and control state machine for sending data captured by verification module 160 to at least one of controller 400 and host workstation 110 for processing. Configuration parameters defining verification module 160 may be set during the design verification setup process.

Operationally, verification module 160 may respond to configuration parameters set during setup process or modified during testing. Based on these parameters, verification module 160 captures and sends a full design state snapshot of the portion of the device under test, performs cycle to cycle analysis, performs co-simulation or co-emulation, and incrementally modifies which signals are to be probed. Co-simulation, as known to one of ordinary skill in the art, generally refers to, but not limited to, synchronous cycle accurate software-based simulation running on the workstation 110 and FPGA-based emulation running on the prototype board 150. Co-emulation, as known to one of ordinary skill in the art, generally refers to, but not limited to, asynchronous transaction driven software-based simulation running on the workstation 110 and FPGA-based emulation running on the prototype board 150. Data captured by verification module 160 may be post-processed by a computing device or component, such as prototype system interface card 130, host work station 110, or suitable computing device coupled to receive data sent by verification module 160. Post processing may include, but not limited to, timing, state, and protocol analysis. Prior to processing data captured by verification module 160, captured data may be stored in value change database 230. In other embodiments, captured data may be stored in value change database after processing.

In accordance with some embodiments, more than one processor may be configured to operate independently or collaboratively. All processors may be of similar construction, or they may be of differing constructions electrically connected or disconnected from each other. As used herein, "construction" may include physical, electrical, or functional characteristics of the processor. Processors may be physically or functionally separate circuits or integrated in a single circuit. They may be coupled electrically, magnetically, optically, acoustically, mechanically, wirelessly or in any other way permitting communicated between them.

In accordance with some embodiments, memory 210 may be a computer readable memory, such as a random access memory (RAM), a read-only memory (ROM), a hard disk, an optical disk, a magnetic medium, a flash memory, other permanent, fixed, volatile memory, non-volatile memory, or any other tangible mechanism capable of providing instructions to processor 200 or similar component. For example, memory 210 may store instructions and data to perform verification functions on prototype card 150 in accordance with information stored in design database 220. Memory 210 may be distributed. That is, portions of memory 210 may be removable or non-removable, or located in geographically distinct locations.

In accordance with some embodiments, design database 220 may be a structured collection of tables, lists, or other data for design verification setup and runtime execution. As such, the structure may be organized as a relational database or an object-oriented database. In other embodiments, design database 220 may be a hardware system comprising physical computer readable storage media and input and/or output devices configured to receive and provide access to tables, lists, or other data structures. Further, configured as a hardware system design database 220 may include one or more processors and/or displays. While similar in structure, value change database 230 may be configured to store information received from prototype card 150. For example, value change database may be configured to store information related to signal values captured by signal probes associated verification module 160.

In accordance with some embodiments I/O devices 240 may be one or more of a mouse, stylus, keyboard, audio input/output device, imaging device, printing device, display device, sensor, wireless transceiver, or other similar device. I/O devices 240 may also include devices that provide data and instructions to memory 210, processor 200, design database 220, or value change database 230.

In accordance with some embodiments, interfaces 250 may include external or integrated interface card or interface port, such as PCI Express, Ethernet, FireWire®, USB, and wireless communication protocols. For example, interfaces 250 may be a PCI Express card coupled to communicate with host interface card 120 using host communication channel 115. IO devices 240 may also include a graphical user interface, or other humanly perceivable interfaces configured to present data.

Figure 3:
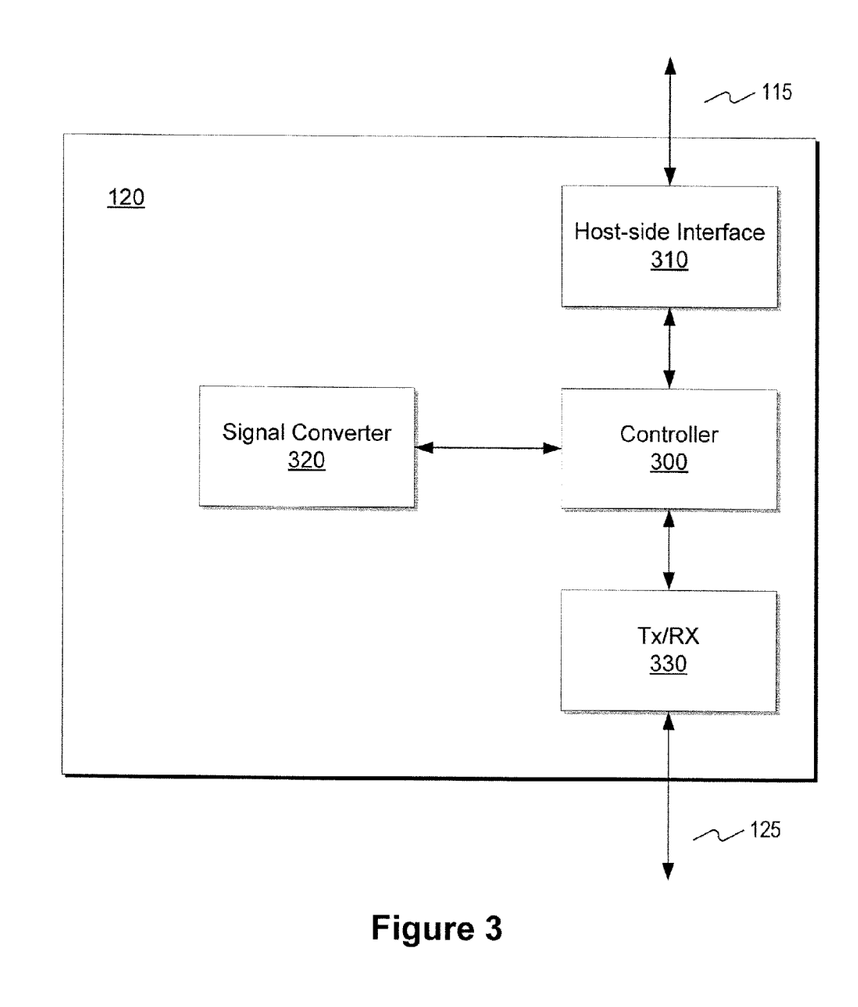
FIG. 3 illustrates a block diagram of an exemplary host-side interface card consistent with disclosed embodiments.

FIG. 3 illustrates a block diagram of an exemplary host interface card 120 consistent with disclosed embodiments. By way of example, and as illustrated in FIG. 3, host interface card 120 may include one or more of host-side interface 310, controller 300, signal converter 320, and transceiver 330. Host-side interface 310 may be similar to interfaces 250 and configured to facilitate communication with host workstation 110 using host communication channel 115. In other embodiments, host-side interface 310 may be different from interfaces 250, and may include physical or logical signal conversion components to facilitate communication with host work station 110.

In accordance with some embodiments, controller 300 may be a component similar to processor 200. In some embodiments, controller 300 may act upon data or instructions received from host workstation 110, signal converter 320, or prototype system interface card 130 through transceiver 330. For example, controller 300 may exchange commands and data with one or more verification modules 160 to control and monitor a device state associated with one or more of FPGA devices 155*a*-155*d*. In other embodiments, controller 300 may send commands or data to verification module 160 causing the verification module 160 to modify, among other things, the amount of data captured and the number or type of signals probed. Signal converter 320 may include a processor specifically configured to convert data exchanged over interface card communication channel 125 into a suitable format for processing by host workstation 110.

Transceiver 330 may include any appropriate type of transmitter and receiver to transmit and receive data from prototype card 150. In some embodiments, transceiver 330 may include one or a combination of desired functional component(s) and processor(s) to encode/decode, modulate/demodulate, and to perform other functions related to the communication channel between host interface card 120 and prototype card 150. Transceiver 330 may be coupled to communicate with prototype system interface card 130 over interface card communication channel 125. In some embodiments, interface communication channel 125 may utilize a high throughput low-latency communication channel technology, such as Fiber Channel.

Figure 4:
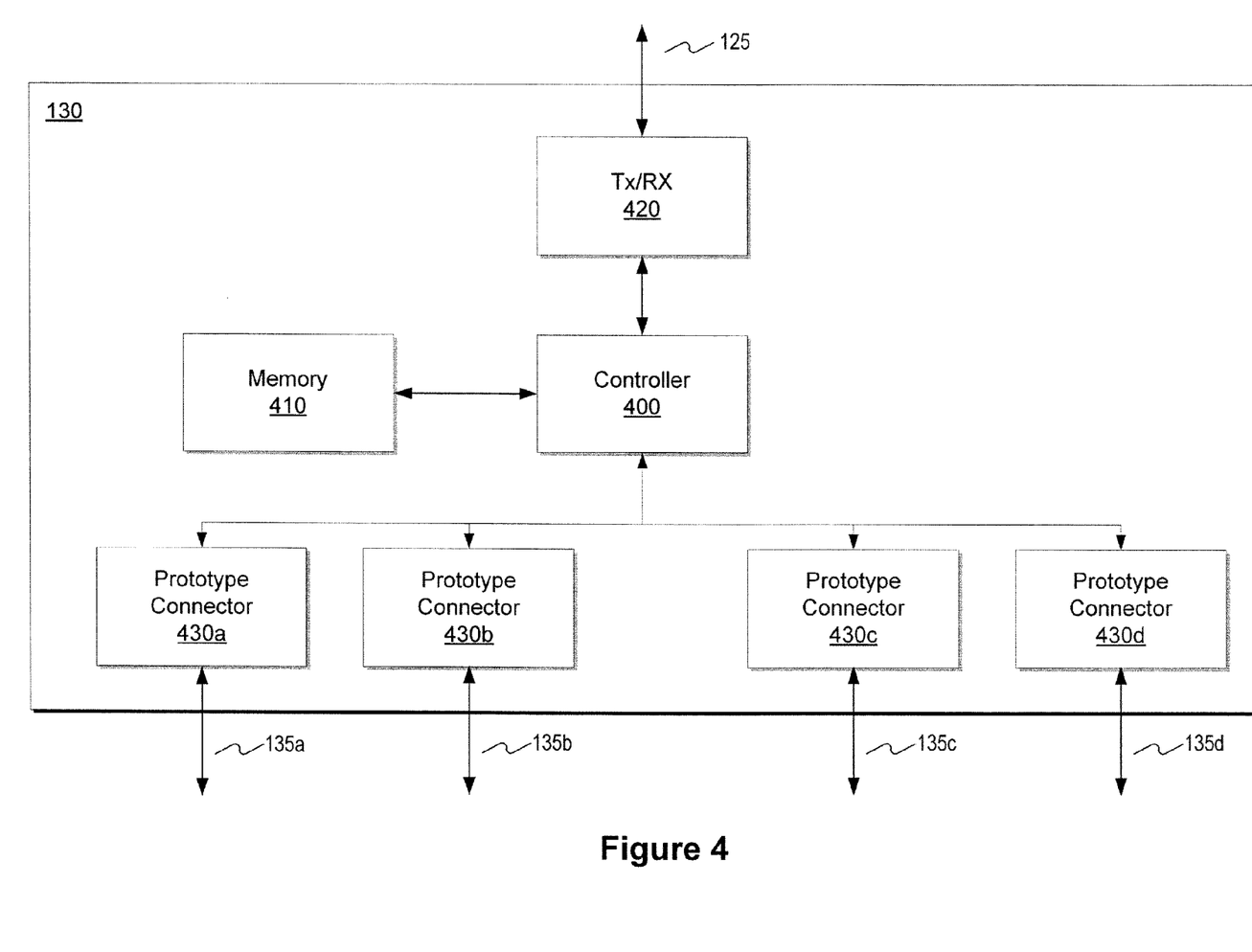
FIG. 4 illustrates a block diagram of an exemplary prototype system interface card consistent with disclosed embodiments

FIG. 4 illustrates a block diagram of an exemplary prototype system interface card 130 consistent with disclosed embodiments. By way of example, and as illustrated in FIG. 4, prototype system interface card 130 may include one or more of, controller 400, memory 410, transceiver 420, and prototype connectors 430*a*-430*d*. Generally, controller 400, memory 410, and transceiver 420 may be similar to controller 300, memory 210, and transceiver 330, respectively. As shown in FIG. 4, controller 400 may be coupled to receive data or instructions from memory 410 and transceiver 420. For example, controller 400 may act upon instructions to send timing and control information to verification modules 160 located in each FPGA chip on prototype card 150. Instructions may include, but not limited to, configuration parameters and runtime control information received from host interface card 120.

Timing and control information may include, but not limited to, commands and data associated with probing signals to gather time-based or state-based information associated with a device or device state. Timing information may include clock signals generated, received, or processed by controller 400. Timing signals may also include start, stop, and reset signals. Received by verification module 160, timing information may serve as basis to probe, capture, and process timing and state analysis data associated with a device under test. For example, timing and control information sent by controller 400 may provide a basis for creating a trigger sequence, capturing data from the device under test, assigning a time reference to captured data, sampling signal values, and configuring one or more signals within the FPGA to be used as a clock when performing state analysis. In some embodiments, controller 400 may be configured to store data captured from the FPGA chips in memory 410. Data may include timing data, state data, and meta data associated with the captured data. Meta data may include, among other things, a time reference or signal name. Captured data associated with a particular signal or signals stored in memory 410 may be compared to data associated with the same signal, but captured at a later time. In some embodiments, controller 400 may also be configured to encode and/or decode data exchanged with one or more verification modules 160 located in each FPGA chip.

Prototype system interface card 130 may also include one or more prototype connectors coupled to controller 400. For example, prototype connectors 430a-430d may be a J-connector or other connector type with signal transmission properties suitable to exchange commands and data between controller 400 and prototype card 150. Prototype connectors 430a-430d may be configured to receive corresponding J-connector compatible cables 135a-135d, respectively. In some embodiments, prototype system interface card 130 may include greater than or less than four prototype connectors in accordance with the particular system requirements. Prototype system interface card 130 may be configured to enable various logical configurations, both predefined and configurable, to physically connect to FPGA chips.

In some embodiments, a combination of the structural and functional components of prototype system interface card 130 may be embedded or otherwise physically co-located in prototype card 150. For example, some or all of components controller 400, memory 410, and transceiver 420 may be located on prototype card 150. In other embodiments, the functionality of one or more of controller 400, memory 410, and transceiver 420 may integrated into other components located on or coupled to communicate with prototype card 150. In configurations where some or all of the components or functionality of prototype system interface card 130 reside on prototype card 150, host interface card 120 may be coupled to prototype card 150 using host communication channel 125 or other suitable communication method.

Returning to FIG. 1, exemplary prototype card 150 may be a pre-fabricated or customized test board suitable for testing the design under test implemented in one or more FPGA chips. By way of example, and as illustrated in FIG. 1, prototype card 150 may include one or more FPGA devices 155a-155d, coupled to communicate with host workstation 110 through connector 140. Although depicted as a single connector, connector 140 may be one or more connectors, such a J-connector or similarly suitable connector. Similarly, although depicted as including four FPGA devices, prototype card 150 may have more or fewer FPGA devices in accordance with the particular system requirements. In some embodiments, prototype card 150 may be logically or physically partitioned across a combination of multiple FPGAs, printed circuit boards, or other hardware suitable to facilitate design verification testing using FPGA devices.

Figure 5:
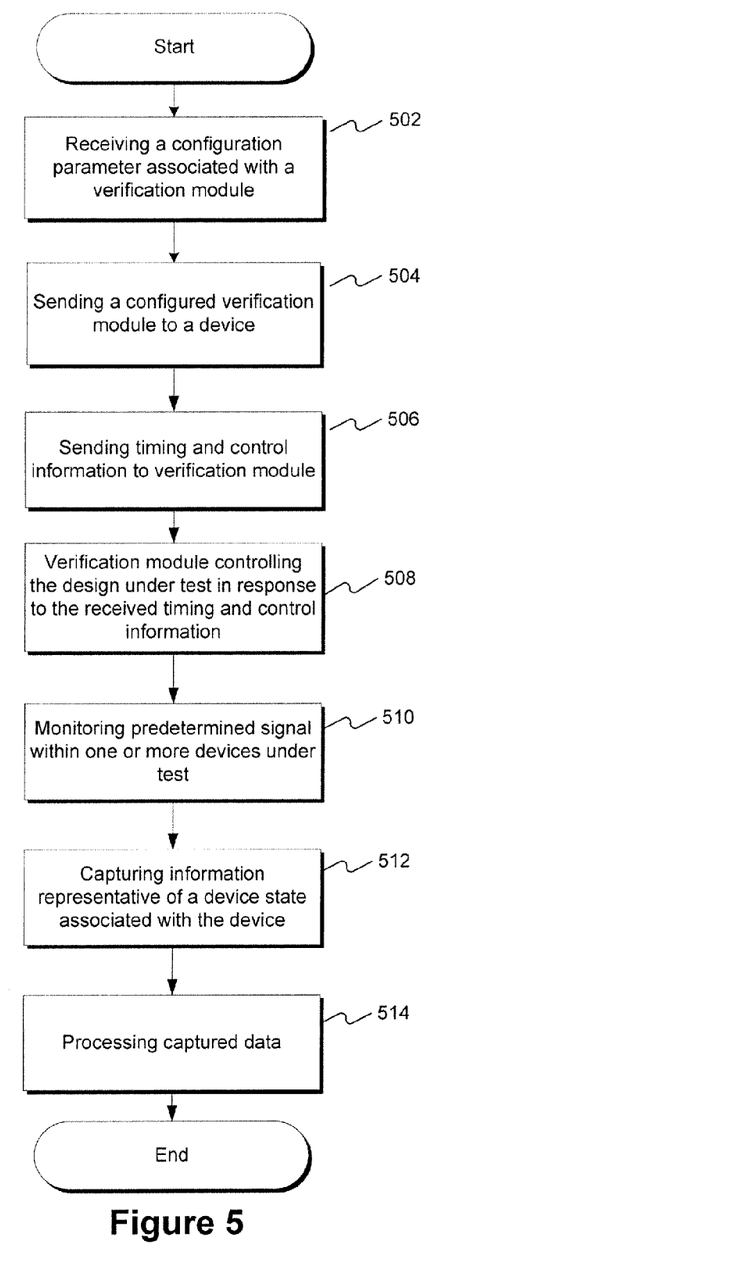
FIG. 5 illustrates a flow diagram of an exemplary method for implementing a prototype system consistent with disclosed embodiments.

FIG. 5 illustrates a flow diagram of an exemplary method 500 for implementing a prototype system consistent with disclosed embodiments. As shown in FIG. 5, in step 502, a first interface component may be configured to receive a configured image representative of at least a portion of a user design and an associated verification module. The configured image may include, among other things, one or more configuration parameters associated with a portion of the user design and/or verification module 160. For example, configuration parameters may include parameters associated with design flow setup, functionality of verification module 160, and construction of design database 220. More specifically, detailed prototype board information such as FPGA, connector, and interconnection may also be included in the configuration parameter. In step 504, the first interface component may be configured to send a configured verification module 160 to a device under test. In some embodiments, step 504 may occur during the system setup process. In other embodiments, step 504 may occur during device testing to reconfigure the functionality of verification module 160. In reconfiguring the configured image, a first interface component, such as host interface card 120, may send commands received from host workstation 110 operable to reconfigure the number, type, and manner in which signal may be analyzed based on design information included in design database 220. In other embodiments, host interface card 120, may send commands received from host workstation 110 operable to reconfigure a portion of the user design separately or in addition to commands leading to the reconfiguration of verification module 160.

In step 506, a second interface component may be configured to send timing and control information to verification module 160 based on at least one of the configuration parameters and runtime control information received from the first interface component. In some embodiments, timing information may include clock signals generated from or processed by the second interface component, such as prototype system interface card 130. In some embodiments, control information may include information associated with an analysis trigger sequence or condition. Control information may include, but not limited to, commands associated with creating signal probes for analysis of selected signals. In step 508, verification module 160 may be configured to control the device under test in response to the receiving timing and control information from the second interface component. For example, controlling the device under test may include setting value or sampling of a predetermined set of signals based on timing information received from the second interface component. In some embodiments, sampling may be performed synchronously. In other embodiments, sampling may be performed asynchronously. Controlling the device under test may also include performing using verification module 160, co-simulation or co-emulation type testing.

Alternatively or additionally, in step 510, verification module 160 may monitor predetermined signal within device under test. For example, verification module 160 may include probes configured to analyze one or more signals. Alternatively or additionally, in step 512, verification module 160 may capture information representative of a device state associated with the device. For example, verification module 160 may include a design-dependent circuit, equipped with probes to capture data associated with specific signals. Utilizing access to the design database 220 associated with the device under test, verification module 160 may be reconfigured during a test process to modify, remove, or add probes to capture the same or different signals. Configuration parameters defining verification module 160 may be used to determine which signal may be probed. These parameters may be set during the design verification setup process. Alternatively, verification module 160 may be modified during testing. Based on these parameters, verification module 160 may capture and send a full design state snapshot of the device under test, perform cycle to cycle analysis and capture, perform co-simulation or co-emulation, and incrementally modify which signals are probed. Alternatively, or additionally, in step 514, data captured by verification module 160 may be processed by a computing device or component, such as prototype system interface card 130, host work station 110, or suitable computing device coupled to receive data sent by verification module 160.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A prototyping system for verifying and debugging an integrated circuit design under verification (DUV) comprising:
   a host workstation comprising a processor and a first memory, the host workstation configured to provide a plurality of configured Field Programmable Gate Array (FPGA) images and runtime control information, wherein each of the plurality of FPGA images is downloaded to a respective FPGA device, of a of FPGA devices, and each of the plurality of FPGA images contains a portion of the DUV, and a respective verification module, of a plurality of verification modules, wherein each of the plurality of verification modules is associated with a respective FPGA device; and
   an interface configured to provide timing and control information to each of the plurality of verification modules based on the runtime control information received from the host workstation, the interface comprising a controller and a second memory, the second memory being configured to store probed signal values associated with a first portion of the DUV received from a first verification module, of the of verification modules, and the controller being configured to process the probed signal values,
   wherein the first verification module is coupled with the interface and configured to control and probe the signal values of the first portion of the DUV in response to the timing and control information received from the interface, wherein the first portion of the DUV corresponds to a first FPGA device of the plurality of FPGA devices.

2. The system of claim 1, wherein the interface is further configured to send commands for reconfiguring a first configured FPGA image, of the plurality of FPGA images, in response to a request from the host workstation.

3. The system of claim 1, wherein the controller in the interface is configured to create a trigger condition based at least in part on the runtime control information received from the host workstation.

4. The system of claim 3, wherein the trigger condition is based at least in part on timing information received from the host workstation.

5. The system of claim 1, wherein the first verification module is configured to probe a predetermined signal in response to at least the control information received from the interface.

6. The system of claim 1, wherein the controller in the interface is further configured to provide a clock signal and a reset signal to at least the first verification module.

7. The system of claim 1, wherein the first verification module comprises:
   a first circuit configured to connect to and probe predetermined signals located within the first portion of the DUV; and
   a second circuit configured to perform at least one of decoding and encoding data exchanged with the interface.

8. The system of claim 7, wherein the predetermined signals are based in part on register transfer language (RTL) information included in a design database in the host workstation.

9. The system of claim 1, wherein the processing comprises decoding the received probed signal values.

10. A method comprising:
    receiving, at an interface, from a host workstation, a plurality of configured Field Programmable Gate Array FPGA images and runtime control information, wherein each of the plurality of FPGA images contains a respective portion of an integrated circuit design under verification (DUV), and a respective verification module, of a plurality of verification modules, wherein each of the plurality of verification modules is associated with a respective FPGA device of a plurality of FPGA devices, and each of the FPGA images is downloaded to a respective FPGA device, of a plurality of FPGA devices;
    sending, by the interface, each of the received plurality of configured FPGA images to each of the respective FPGA devices;
    sending, by the interface, timing and control information to each of the respective verification modules, of the plurality of verification modules, based on the runtime control information received from the host workstation;
    controlling, by each of the respective verification modules, the respective portion of the DUV in each of the respective FPGA devices in response to the timing and control information received from the interface;
    receiving, by the interface, from a first verification module of the plurality of verification modules, probed signal values associated with a first portion of the DUV; and
    processing and storing in a memory within the interface, by a controller in the interface, at least a portion of the probed signal values received from the first verification module.

11. The method of claim 10, further comprising:
    creating, by the interface, a trigger condition based on the runtime control information received from the host workstation, wherein the first verification module captures a probed signal value associated with a predetermined signal associated with the first portion of the DUV.

12. The method of claim 11, wherein the trigger condition is based in part on timing information received from the host workstation.

13. The method of claim 10, wherein the first verification module is configured to probe a predetermined signal in response to at least the control information received from the interface.

14. The method of claim 13, wherein the probing is performed synchronously or asynchronously.

15. The method of claim 10, wherein the interface is further configured to send commands for reconfiguring a first configured FPGA image of the plurality of configured FPGA images.

16. The method of claim 15, wherein the reconfiguring of the first configured FPGA image comprises:
    receiving a modified image of the first configured FPGA image; and
    reconfiguring data-dependent circuitry of the modified first configured FPGA image associated with the first verification module.

17. The method of claim 10, wherein the processing comprises decoding the received probed signal values.

* * * * *